United States Patent
Lee et al.

(10) Patent No.: US 7,398,801 B2
(45) Date of Patent: Jul. 15, 2008

(54) APPARATUS AND METHOD FOR PROCESSING WAFERS

(75) Inventors: Kun-Hyung Lee, Sungnam-Si (KR); Soo-Woong Lee, Seoul (KR); Hyun-Ho Cho, Soowon-Si (KR); Hee-Sun Chae, Soowon-Si (KR); Jae-Hyung Jung, Yongin-Si (KR); Sun-Yong Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 200 days.

(21) Appl. No.: 11/292,674

(22) Filed: Dec. 2, 2005

(65) Prior Publication Data

US 2006/0104750 A1 May 18, 2006

Related U.S. Application Data

(63) Continuation of application No. 10/619,112, filed on Jul. 14, 2003, now abandoned.

(30) Foreign Application Priority Data

Feb. 25, 2003 (KR) .............................. 2003-11777

(51) Int. Cl.
   *B65B 1/20* (2006.01)
(52) U.S. Cl. .............................. 141/11; 141/66; 141/69; 141/89; 141/98; 414/217.1; 414/940
(58) Field of Classification Search ................... 141/11, 141/65–67, 69, 85, 89, 98, 325; 414/217, 414/217.1, 935, 940
   See application file for complete search history.

(56) References Cited

U.S. PATENT DOCUMENTS

| | | | | |
|---|---|---|---|---|
| 5,135,608 | A | 8/1992 | Okutani | 156/643 |
| 6,032,704 | A | 3/2000 | Huang et al. | 141/98 |
| 6,074,154 | A | 6/2000 | Ueda et al. | 414/217 |
| 6,109,915 | A | 8/2000 | Liu et al. | 432/253 |
| 6,224,679 | B1 | 5/2001 | Sasaki et al. | 118/719 |
| 6,448,537 | B1 * | 9/2002 | Nering | 219/390 |
| 6,817,822 | B2 | 11/2004 | Tokunaga | 414/217 |
| 6,829,038 | B2 * | 12/2004 | Miwa | 355/53 |
| 7,241,993 | B2 * | 7/2007 | Nakasuji et al. | 250/310 |
| 2002/0142496 | A1 | 10/2002 | Nakasuji et al. | 438/14 |
| 2003/0009904 | A1 | 1/2003 | Tokunaga | 34/406 |
| 2003/0031537 | A1 | 2/2003 | Tokunaga | 414/217 |

FOREIGN PATENT DOCUMENTS

| | | |
|---|---|---|
| JP | 08-046005 | 2/1996 |
| JP | 11-145245 | 5/1999 |
| JP | 11-307623 | 11/1999 |
| KR | 2003-0011536 | 2/2003 |

* cited by examiner

*Primary Examiner*—Timothy L Maust
(74) *Attorney, Agent, or Firm*—Mills & Onello LLP

(57) ABSTRACT

An apparatus and method for manufacturing semiconductor devices are disclosed. In accordance with the invention, a wafer transfer device for transferring wafers from wafer storage containers to wafer processing equipment includes a flow chamber designed to reduce the amount of contaminants that can enter the wafer container. The wafer transfer apparatus provide two gas inlets for allowing two gases to flow through the flow chamber of the transfer apparatus. This results in a reduced amount of contaminants able to enter the wafer container, which in turn results in manufacture of devices with more reliable performance characteristics as well as high manufacturing yield.

28 Claims, 12 Drawing Sheets

APPARATUS AND METHOD FOR PROCESSING WAFERS

RELATED APPLICATIONS

This application is a continuation of U.S. application Ser. No. 10/619,112, filed on Jul. 14, 2003, which relies for priority on Korean Patent Application number 2003-11777, filed on Feb. 25, 2003, the contents of which are incorporated herein in their entirety by reference.

BACKGROUND OF THE INVENTION

As the sizes of semiconductor integrated circuits and the design rule for line widths have decreased, the issue of contamination of the devices and substrates or wafers during processing has become more important. The demand for extremely clean processing environments for these devices has increased. As sizes of wafers has increased, for example, from 200 mm diameter wafers to 300 mm wafers, fully automated systems have also become a requirement for processing the wafers. The area of a 300 mm wafer is 2.25 times larger than the area of a 200 mm wafer, and the 300 mm wafer is about 2.2 times heavier than a 200 mm wafer. These increases in wafer size and weight and in the demand for cleaner processing environments have led to the requirement for complete automation of wafer processing.

The SEMI Standard provides standards for semiconductor processes and processing equipment. For example, the SEMI Standard defines an Equipment Front End Module (EFEM), which includes a wafer or substrate carrier handler that receives wafer carriers from the factory material handling system at one or more of its load ports (as specified in SEMI E15.1). The EFEM generally includes load ports for receiving the carriers, a transfer unit and a frame or "mini-environment."

A conventional open-type wafer container is typically exposed to the clean room environment. As a result, the entire clean room conventionally was maintained at the required cleanliness of the wafers. As the cleanliness requirements have become more stringent, maintaining an acceptable clean room has become extremely expensive. A closed-type wafer container can separate environments in the clean room by preventing exposure of the wafers in the container to the clean room environment. A front opening unified pod (FOUP) is one type of closed-type wafer container.

U.S. Pat. No. 6,074,154 discloses a conventional substrate processing system with a substrate transfer system. U.S. Pat. No. 6,032,704 discloses a conventional wafer storage container or pod used in wafer processing systems. Both of these U.S. patents are incorporated herein in their entirety by reference.

FIG. 1 contains a schematic top view of a manufacturing process system or tool 10 having an EFEM 40. The EFEM includes a frame 12 and a plurality of wafer pod load stations 14. An interface wall 16 separates the clean room 18 from the gray area 20 where the processing system 10 is housed. A single wafer process tool may include one or more load lock chambers 22, a central transfer chamber 24 and a plurality of processing chambers 26 mounted on the transfer chamber 24. A robot 28 disposed in the frame 12 moves wafers from wafer pods disposed on the pod loading stations 14 into the load lock chamber 22. A robot 30 disposed in the transfer chamber 24 moves wafers from the load chamber 22 into the processing chamber 26. The pod load stations 14 receive the pods (FOUPs), and the wafers carried in the FOUPs are transferred into the frame 12 and the wafer process equipment 10.

FIG. 2 contains a cross-sectional view of the processing system 10 and EFEM 40 having a fan 42 and a filter 44 which intake air into a wafer handling zone of the EFEM 40. When a silicon wafer is exposed to air, an undesired native oxide is grown. In a conventional system, to reduce the oxide grown, the fan 42 can inject an inert gas instead of air into the EFEM 40. However, the cost for this approach is very high. A wafer container or pod (FOUP) 13 is mounted on a port 14 of the EFEM 40. The EFEM 40 includes a platform 15 on which wafers transferred from the pod 13 can be mounted.

A wafer container having an injector of inert gas is described in U.S. Pat. No. 6,032,704, incorporated by reference above. However, a drawback of this technology is that the handler or EFEM or the wafer container have a complicated configuration and high cost.

SUMMARY OF THE INVENTION

The invention is directed to an approach for reducing the amount of contaminants in a wafer processing system., In one aspect, the invention is directed to an apparatus and method for processing a wafer. A flow chamber includes a first gas inlet for allowing a first gas to flow in the flow chamber. A wafer inlet at which the wafer enters the flow chamber is coupled to a wafer storage device. A wafer outlet at which the wafer exits the flow chamber is adapted to be coupled to a wafer processing apparatus. A robotic apparatus in the flow chamber moves the wafer from the wafer inlet to the wafer outlet. A second gas inlet allows a second gas to enter the flow chamber such that the second gas combines with the first gas and flows into the wafer storage device, such that the amount of contaminants entering the wafer storage device is reduced.

The first gas can include clean dry air. The second gas can be an inert, stable gas. The second gas may include nitrogen, argon, helium and/or clean dry air.

In one embodiment, the wafer storage device is a front-opening unified pod (FOUP). The apparatus of the invention can be an equipment front-end module (EFEM).

The first gas has a substantially laminar flow in the flow chamber. The second gas also has a substantially laminar flow in the flow chamber. The second gas does not introduce turbulence into the flow chamber. The combined flow of the first and second gases is substantially laminar.

The apparatus of the invention may include a fan for moving the first gas into the flow chamber and a filter for filtering the first gas flowing in the flow chamber. The flow chamber may comprise a mini-environment. The apparatus may also include a third gas inlet for allowing a third gas to enter the flow chamber. In one embodiment, the robotic element is a wafer handler.

In another aspect, the invention is directed to an apparatus and method for manufacturing a semiconductor device. In accordance with this aspect of the invention, the wafer storage device stores a semiconductor wafer on which the device is to be manufactured. A wafer processing apparatus performs a manufacturing process on the wafer, and the wafer transfer apparatus transfers the wafer between the wafer storage device and the wafer processing apparatus. The wafer transfer apparatus includes a flow chamber having a first gas inlet for allowing a first gas to flow in the flow chamber. A wafer inlet at which the wafer enters the flow chamber is coupled to the wafer storage device. A wafer outlet at which the wafer exits the flow chamber is adapted to be coupled to the wafer processing apparatus. A robotic apparatus in the flow chamber moves the wafer from the wafer inlet to the wafer outlet. A second gas inlet allows the second gas to enter the flow chamber such that the second gas combines with the first gas and flows into the wafer storage device, such that the amount of contaminant entering the wafer storage device is reduced.

The first gas can include clean dry air. The second gas can be an inert, stable gas. The second gas may include nitrogen, argon, helium and/or clean dry air.

In one embodiment, the wafer storage device is a front-opening unified pod (FOUP). The apparatus of the invention can be an equipment front-end module (EFEM).

The first gas has a substantially laminar flow in the flow chamber. The second gas also has a substantially laminar flow in the flow chamber. The second gas does not introduce turbulence into the flow chamber. The combined flow of the first and second gases is substantially laminar.

The apparatus of the invention may include a fan for moving the first gas into the flow chamber and a filter for filtering the first gas flowing in the flow chamber. The flow chamber may comprise a mini-environment. The apparatus may also include a third gas inlet for allowing a third gas to enter the flow chamber. In one embodiment, the robotic element is a wafer handler.

In one embodiment, the wafer processing apparatus is a chemical vapor deposition apparatus. In another embodiment, the wafer processing apparatus is a furnace. The wafer processing apparatus may also be a dry etch apparatus or a metrology apparatus.

The wafer processing system of the invention provides numerous advantages over prior approaches. Because of the two gas inlets resulting in two gas flows in the flow chamber of the transfer apparatus, contaminants are substantially prevented from entering the wafer storage device, i.e., FOUP. As a result, more reliable devices can be fabricated at much higher yield.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS OF THE INVENTION

Figure 1:
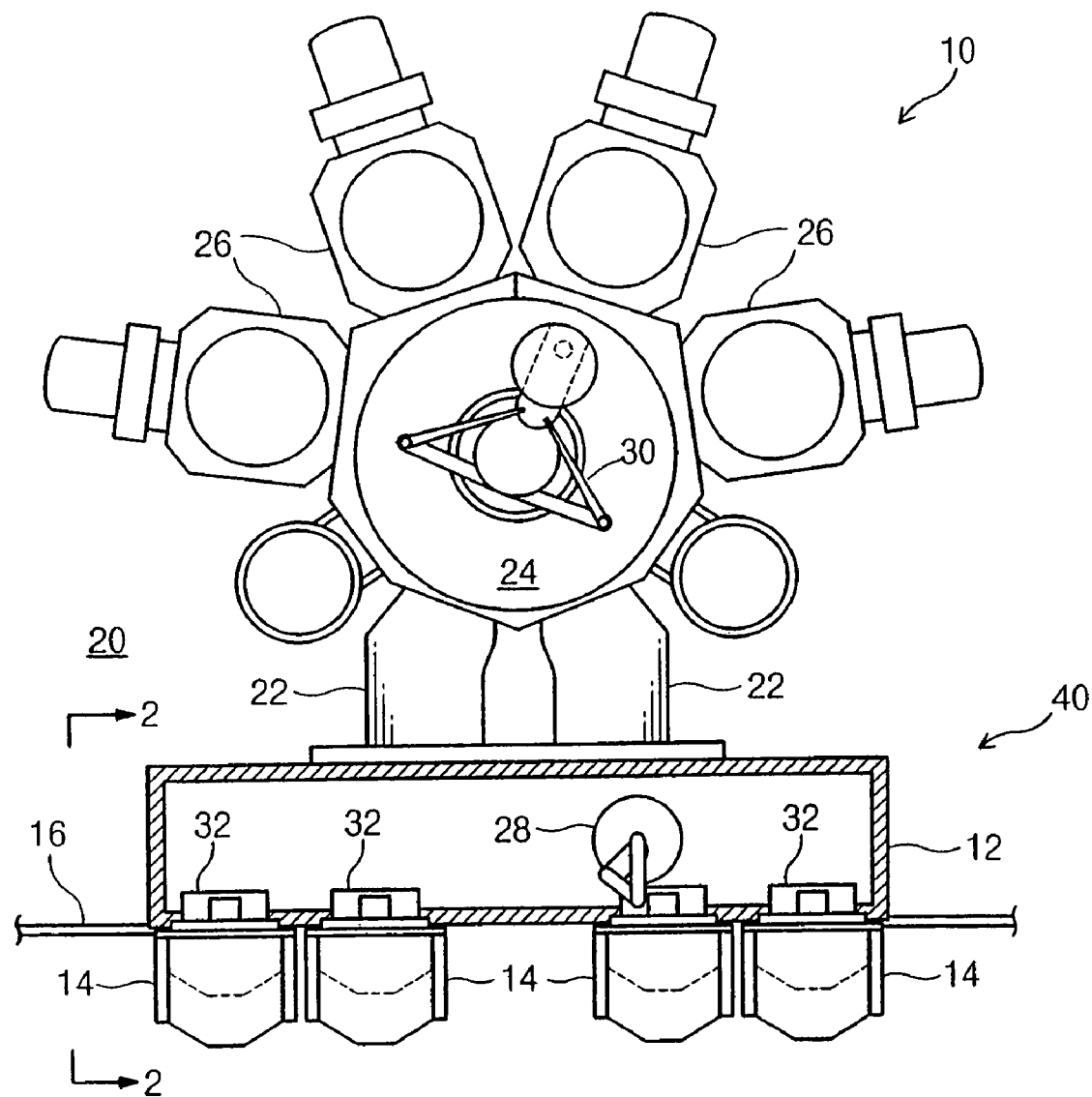
FIG. 1 is a schematic view of a conventional wafer processing system.
Figure 2:
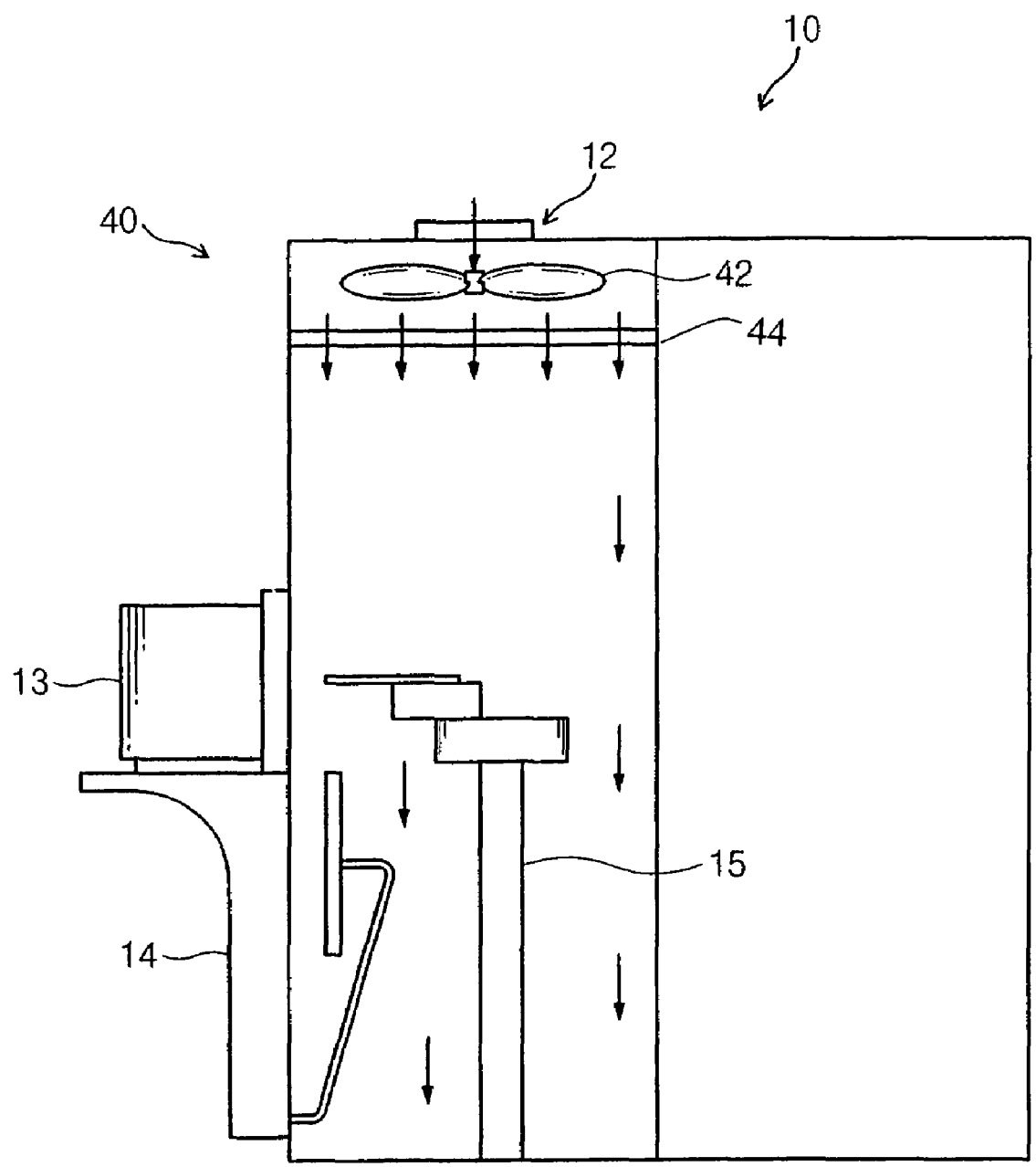
FIG. 2 is a cross sectional view of the wafer processing system of FIG. 1.
Figure 3:
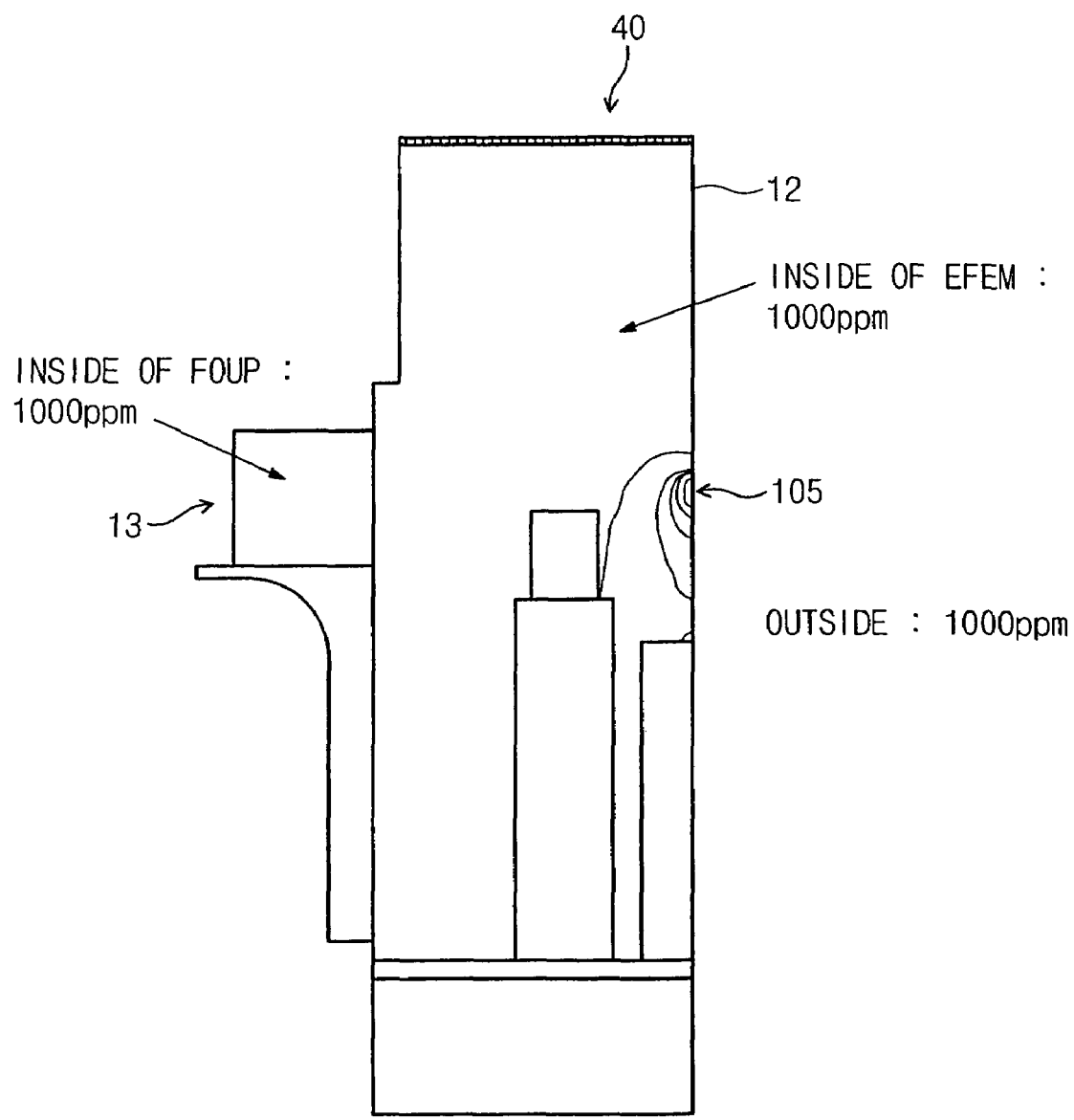
FIG. 3 is a simulative graph of an EFEM showing conventional distribution of $NH_3$ contaminants inside and outside of the EFEM.
Figure 4:
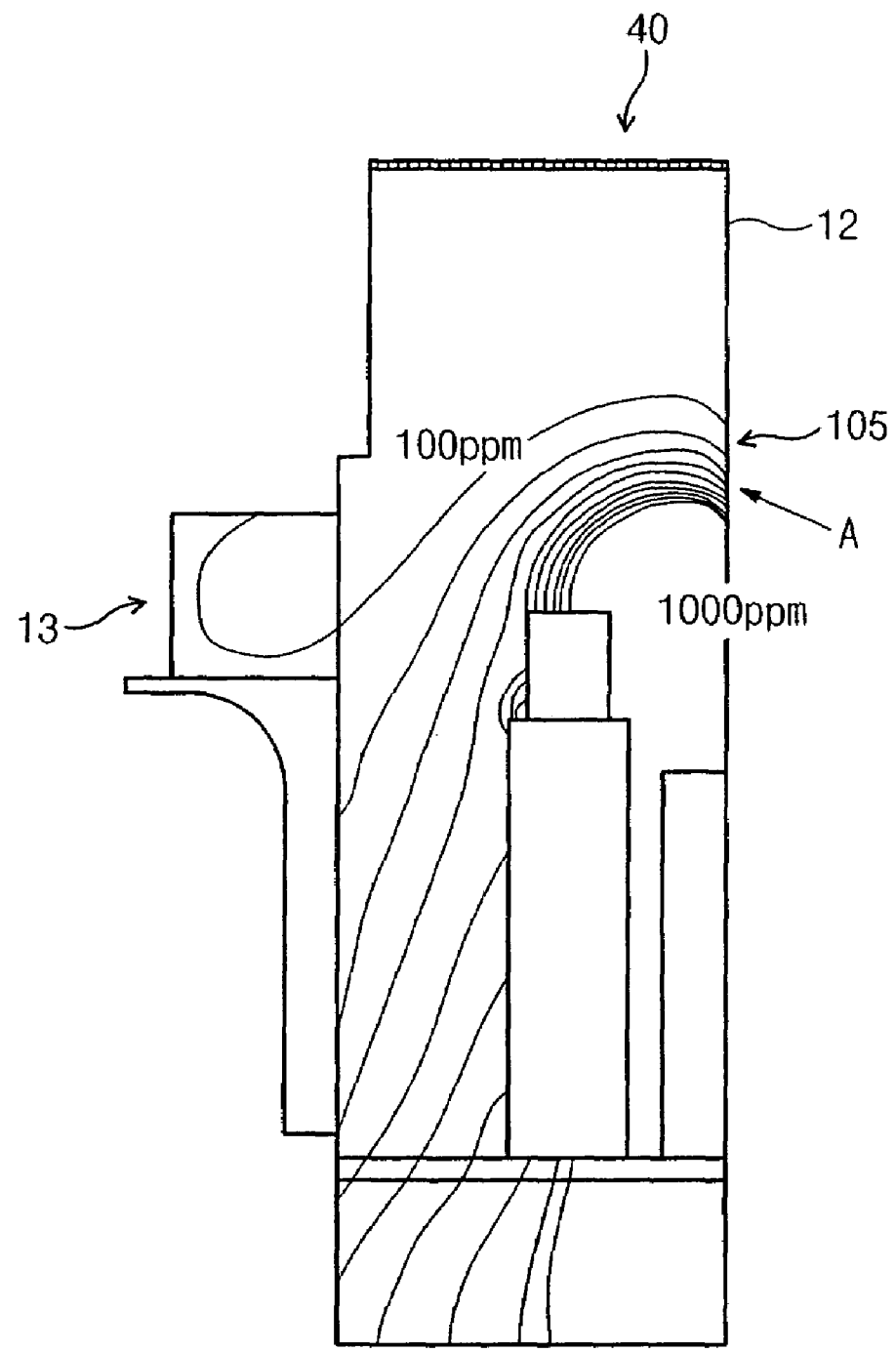
FIG. 4 is a simulative graph of an EFEM showing conventional distribution of $Cl_2$ contaminants in the EFEM.

FIGS. 3 and 4 illustrate simulated contaminant distribution in an EFEM 40 and FOUP 13. FIG. 3 illustrates the distribution of contaminants, which in this exemplary illustration include $NH_3$ contaminants, from outside the EFEM 40. FIG. 4 illustrates the distribution of contaminants, which in this exemplary illustration include $Cl_2$ contaminants, introduced into the EFEM 40 and FOUP 13 from the adjacent wafer processing equipment.

FIG. 3 illustrates contaminants outside and inside the EFEM. The concentration of contaminants, in this example $NH_3$ contaminants, is indicated by spatial concentration contour lines 105. Contaminants, including $NH_3$ and molecular contaminants such as Cl, F, Br, etc., are introduced into the EFEM 40 and the FOUP 13. Even if particles are filtered, molecular contaminants penetrate the filter and enter the EFEM and FOUP. The molecular contaminants degrade the efficiency and operational characteristics of the devices formed in the semiconductor substrates exposed to the contaminants.

The simulative graph of FIG. 3 simulates the conditions of 0.4 m/sec of air stream from the topside of the frame 12 and 1000 ppm of $NH_3$ contaminant source of the EFEM. As a result, 1000 ppm of $NH_3$ is detected inside the EFEM 40, outside the EFEM 40 and inside the FOUP 13.

FIG. 4 shows contaminants introduced into the EFEM 40 and FOUP 13 from process equipment such as chemical vapor deposition (CVD) equipment, dry etch equipment, thermal furnace, developing equipment or metrology equipment. Contaminants, such as $Cl_2$, are dispersed into the EFEM 40 and the FOUP 13. These contaminants not only produce an undesired native oxide layer on wafers but also degrade operational characteristics and yield of semiconductor chips.

The simulative graph of FIG. 4 simulates the conditions of 0.4 m/sec of air stream from the topside of the frame 12 and 1000 ppm of $Cl_2$ contaminant from wafer process equipment which enters the EFEM 40 through the frame 12 at the location marked "A". As a result, as shown by the contaminant concentration contour lines 105, contaminants are detected inside the EFEM 40, and 100 ppm of $Cl_2$ is detected in the FOUP 13.

Figure 5:
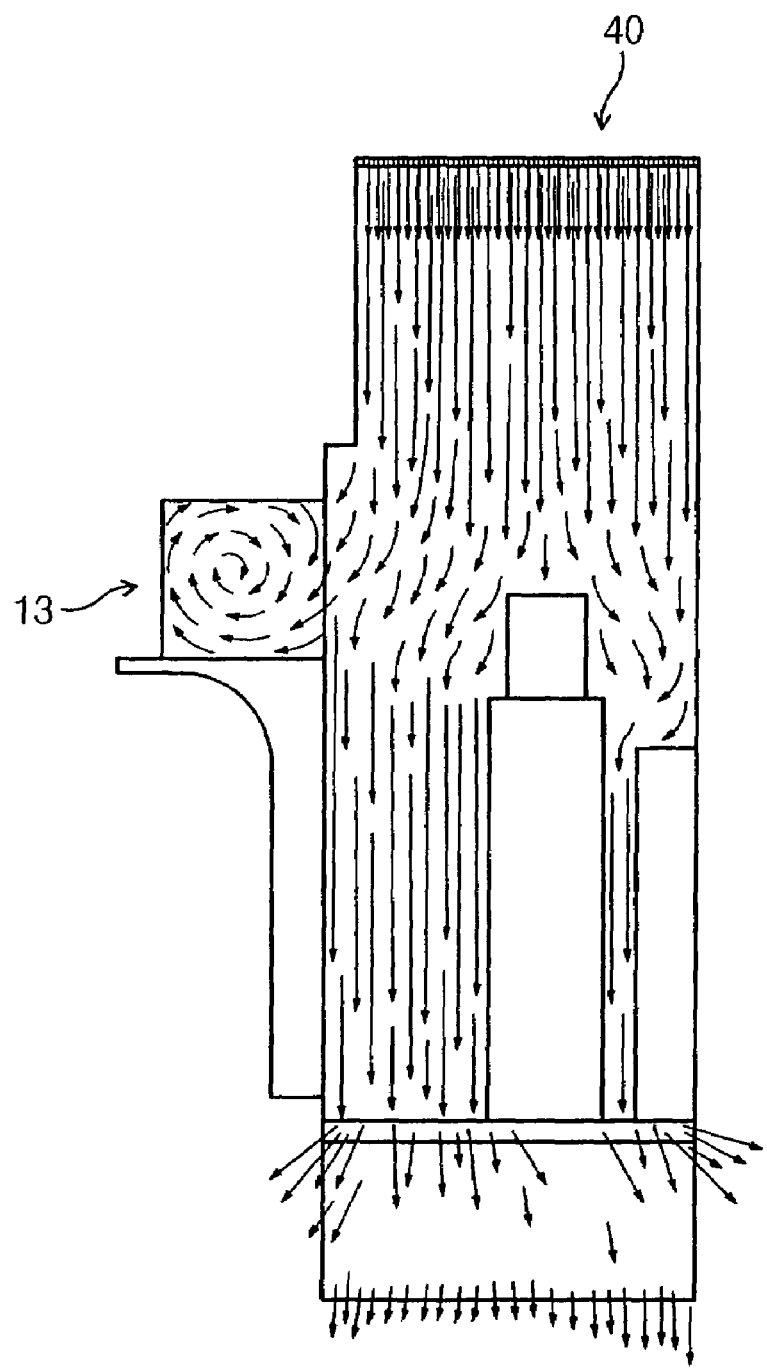
FIG. 5 is a simulative graph image of an EFEM showing an air stream from a top portion into a bottom portion showing laminar flow and swirling flow in the conventional EFEM and a wafer container mounted thereon.

FIG. 5 contains an image which illustrates a simulated profile of conventional air flow from the top side of the EFEM 40 in a conventional configuration. As shown in the figure, a portion of the air stream flows into and circulates within a wafer storage container, for example, the FOUP 13, through an opening at a side wall of the EFEM 40. Even if the air stream is clean, the air may contain oxides, moisture, etc., and, therefore, could produce undesired native oxide on the in the container. This native oxide can degrade the performance and yield of semiconductor devices formed in the wafer. For example, if the native oxide forms on a contact hole including polysilicon, the resistance of the contact increases.

Figure 6:
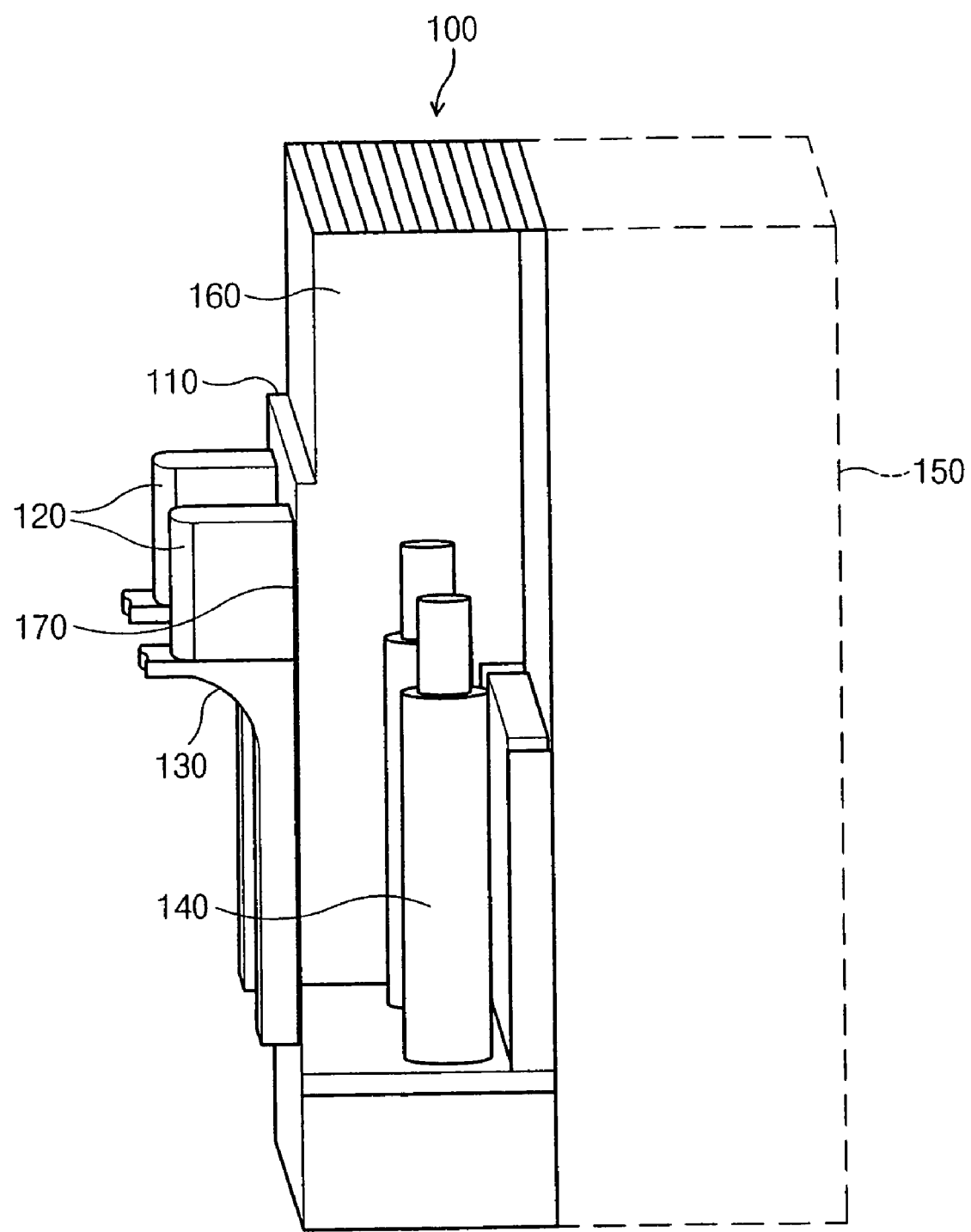
FIG. 6 is a schematic perspective view of an EFEM in accordance with the present invention showing an inert gas nozzle installed in the EFEM.

FIG. 6 contains a schematic perspective view illustrating an embodiment of an EFEM 100 in accordance with the present invention. In accordance with the invention, in addition to the gas, e.g., air, introduced into the EFEM 100 from the top side, an additional gas flow is introduced into the EFEM 100 of the invention to substantially reduce or eliminate the flow of contaminants into the FOUP. In accordance with the invention, the EFEM 100 includes a gas nozzle 110 in the frame 160, which allows for the introduction of an additional flow of gas into the EFEM 100. Specifically, a stable, inert gas such as $N_2$, Ar, He, clean dry air, etc., is allowed to flow into the EFEM 100. In one embodiment, the flow of the second gas into the EFEM 100 is accomplished with little or no interruption in the laminar flow of the gas entering the EFEM 100 at its top side. This combined flow of gases prevents the flow of gas and contaminants into the FOUP. As a result, contamination of the wafers stored in the FOUP is virtually eliminated.

Referring to FIG. 6, FOUPs 120 are loaded on the wafer load station 130. A transfer mechanism or platform 140 is installed in the frame 160. Wafers are transferred into process equipment 150, such as, for example, CVD equipment, dry etch equipment, thermal furnace, metrology equipment, etc., by the transfer mechanism 140. The FOUP2 120 are loaded or unloaded on the wafer load station 130 by a container transfer mechanism such as an overhead transfer (OHT) or overhead conveyor (OHC) system and an automatic guided vehicle (AGV or RGV) system. Wafers are transferred to the process equipment 150 via an opening 170 in a side wall of the frame 160. In one embodiment, the inert gas nozzle 110 is installed at a side of the frame 160 in order to inject inert gas and comply with air stream or air flow into the FOUP 120. A preferred position of the inert gas nozzle 110 is adjacent to and above the opening 170 in the frame 160, as shown in the figure.

A fan (not shown) is installed the upper portion of the frame 160 in order to create an air stream from the upper portion to the bottom portion of the frame 160. A filter (not shown) may be installed in the frame 160 for cleaning the air stream. Using this system of the invention, the clean room is separated to International Standard Organization (hereinafter as "ISO") Class 5 and ISO Class 2 for economic maintenance. The semiconductor process path, such as the FOUP and EFEM environments are above ISO Class 2, and the outside of the process path is under ISO Class 5.

Figure 7:
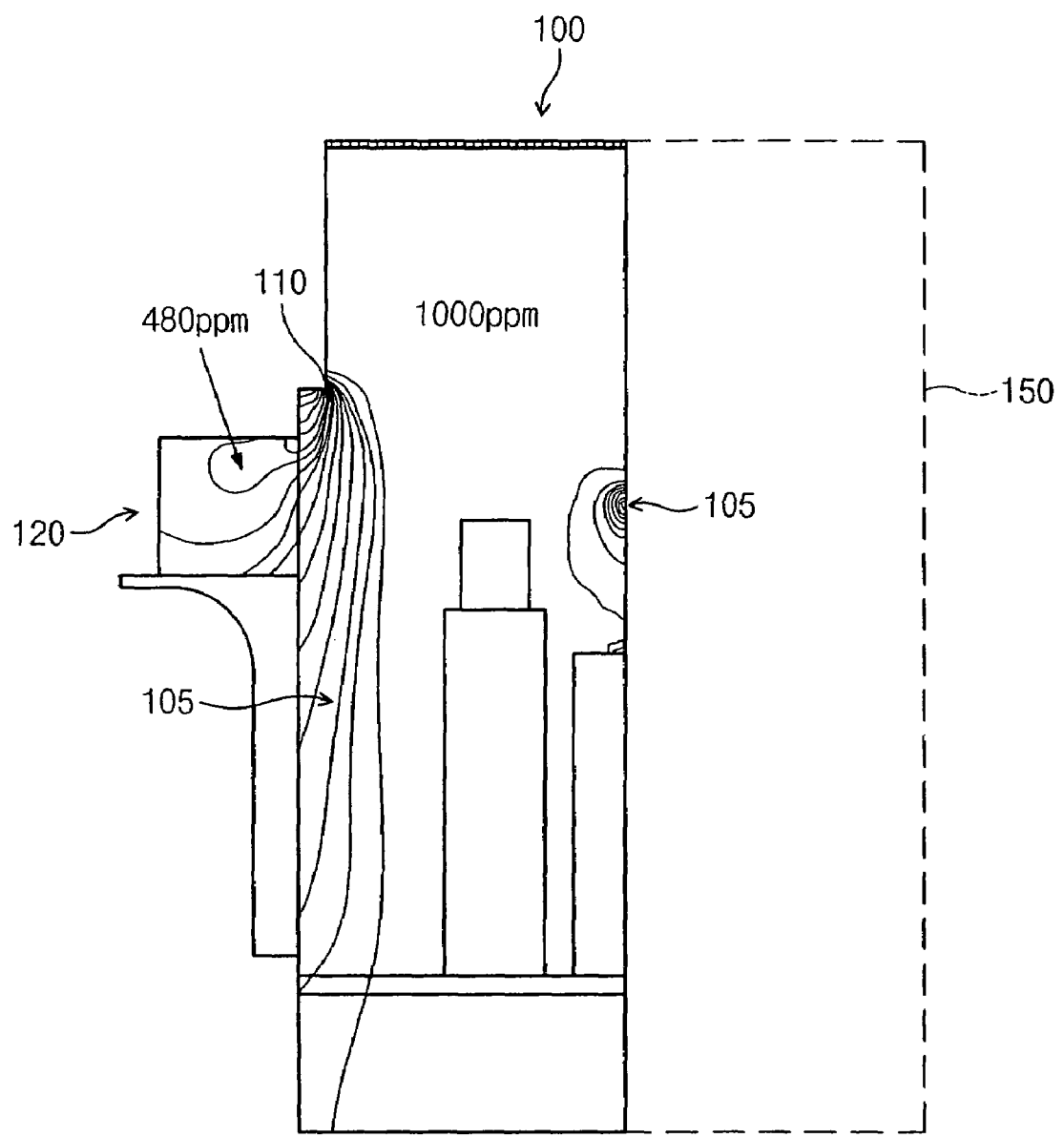
FIG. 7 is a simulative graph of an EFEM in accordance with the present invention showing distribution of $NH_3$ contaminants in a wafer container and the EFEM.

FIG. 7 illustrates a simulated contaminant distribution in the FOUP 120 and the EFEM 100 in the configuration of the present invention, that is, with the additional gas flow introduced into the EFEM 100. In particular, FIG. 7 illustrates, via the concentration contour lines 105, spatial distribution of $NH_3$ contaminants. The simulated graph of the contaminant distribution is simulated by conditions of 0.4 m/sec of air stream from the top side of the frame 160 and 1000 ppm of $NH_3$ contaminant source from the clean room, that is, outside of the frame 160. As shown in the figure, in the configuration of the invention, less than 500 ppm (480 ppm) of $NH_3$ is detected in the FOUP 120. This is an large improvement over the $NH_3$ concentration in the conventional configuration, as illustrated in FIG. 3, where 1000 ppm of $NH_3$ was detected in the FOUP.

When the manufacturing process steps are performed in the configuration of the present invention, wafers in the FOUP 120, which is filled with inert gas such as nitrogen, helium or argon, are transferred into the EFEM 100, in which the lamina-flow air stream flows from the upper side of the frame 160 to the bottom side of the frame 160. The inert gas introduced via the gas nozzle 110 protects wafers from oxidation and prevents contamination from wafer to wafer. The inert gas with the air stream from upper side of the EFEM 100 can flow as laminar flow and does not interfere with the environment of the EFEM 100.

If the inert gas introduced in accordance with the invention interrupts the laminar flow of the air stream by introducing turbulence, it is possible that the wafer and the inside environment of the EFEM may be contaminated by a contaminant introduced by the process equipment 150 or entering the EFEM 100 by other routes, such as the air fan at the top side of the frame 160. Also, if the injection of inert gas is per- formed at too high a pressure, second contamination caused from contaminates of the FOUP can occur. Accordingly, in the preferred embodiment of the invention, the flow of inert gas does not interfere with the flow of the air stream. The speed of air flow and inert gas can be reciprocally determined for laminar flow.

Figure 8:
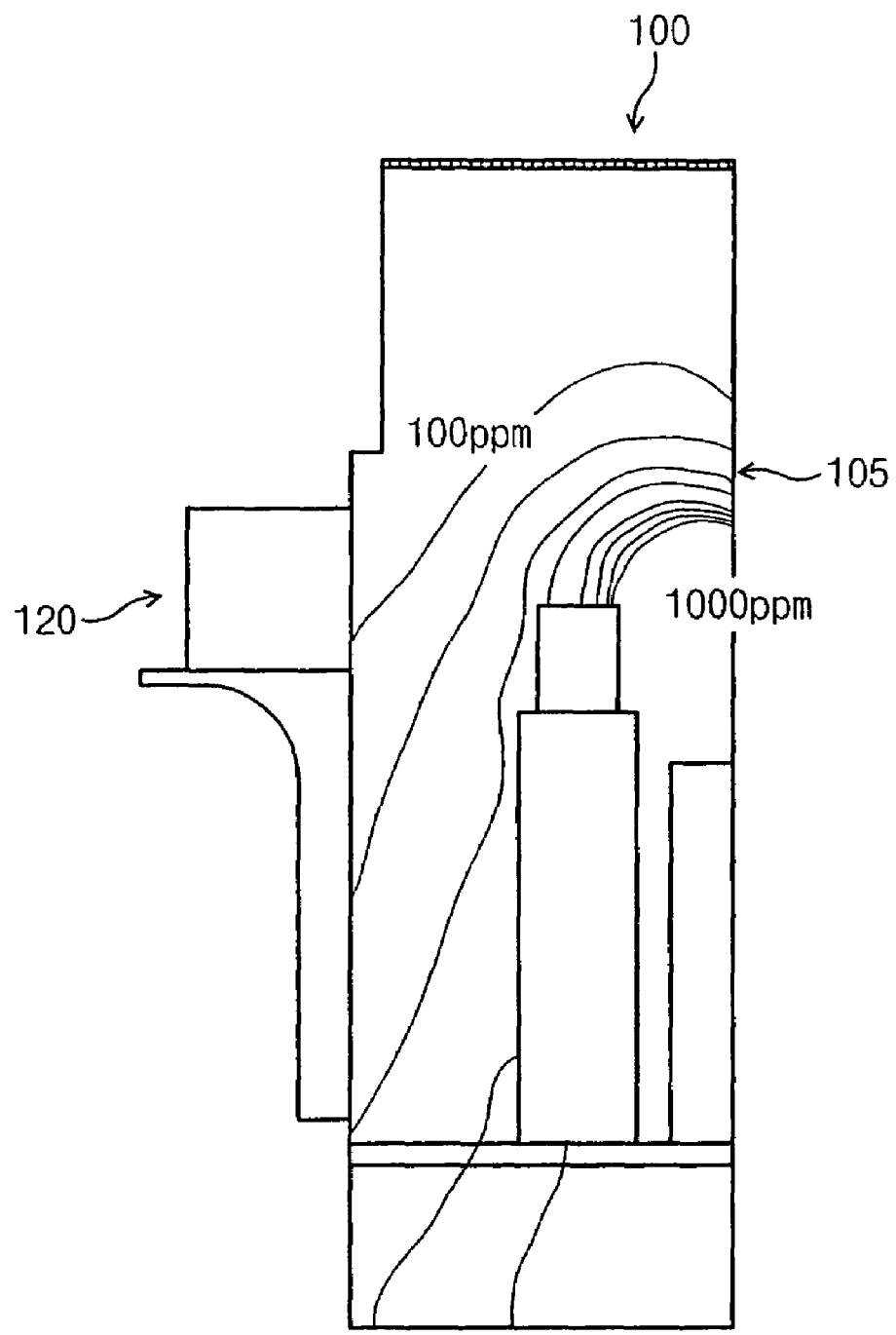
FIG. 8 is a simulative graph of an EFEM in accordance with the present invention showing distribution of $Cl_2$ contaminants in a wafer container and the EFEM.

FIG. 8 illustrates a simulated contaminant distribution in the FOUP 120 and the EFEM 100 in the configuration of the present invention, that is, with the additional gas flow introduced into the EFEM 100. In particular, FIG. 8 illustrates, via the concentration contour lines 105, spatial distribution of $Cl_2$ contaminants. As shown in the figure, even though there are contaminants in the process equipment and the EFEM, there are virtually no contaminants in the FOUP 120. In accordance with the invention, the clean gas or inert gas, e.g., nitrogen, argon, helium, clean dry air, etc., prevents contaminants from reaching the FOUP 120. FIG. 8 illustrates conditions of 0.4 m/sec of air stream and 1000 ppm of $Cl_2$ as contaminant from process equipment 150. As illustrated by the concentration contour lines 105, almost zero ppm of $Cl_2$ is detected in the FOUP 120. The concentration of contaminant is greatly reduced, compared to that of the conventional configuration illustrated in FIG. 4.

Figure 9:
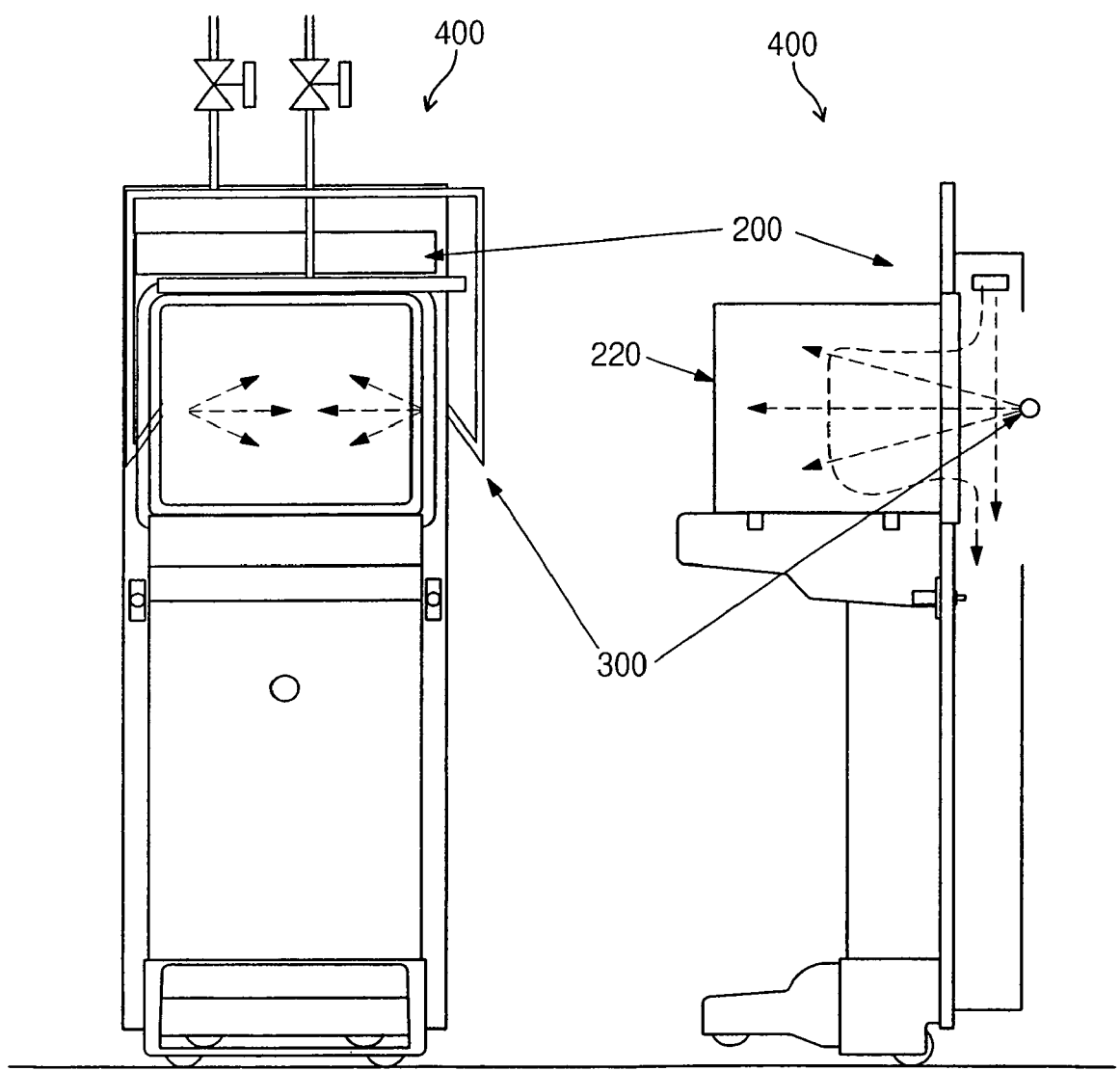
FIG. 9 is a schematic view of inert gas nozzles installed in the EFEM, in accordance with the present invention.

FIG. 9 illustrates another embodiment of the invention showing inert gas nozzles installed in the EFEM 400. The drawings in FIG. 9 are two views of the EFEM 400 rotated ninety degrees to each other. Inert gas nozzles, 200 and 300 are installed in the EFEM 400. The inert gas nozzle 200 introduces inert gas such as nitrogen, argon, helium, etc., or clean dry air into a FOUP 220 and prevents air flowing in the frame from flowing into the FOUP 220. The inert gas nozzle 300 injects inert gas or clean dry air into the FOUP 220. The EFEM 400 in FIG. 9 may be coupled with a wet station as shown in FIG. 10.

Figure 10:
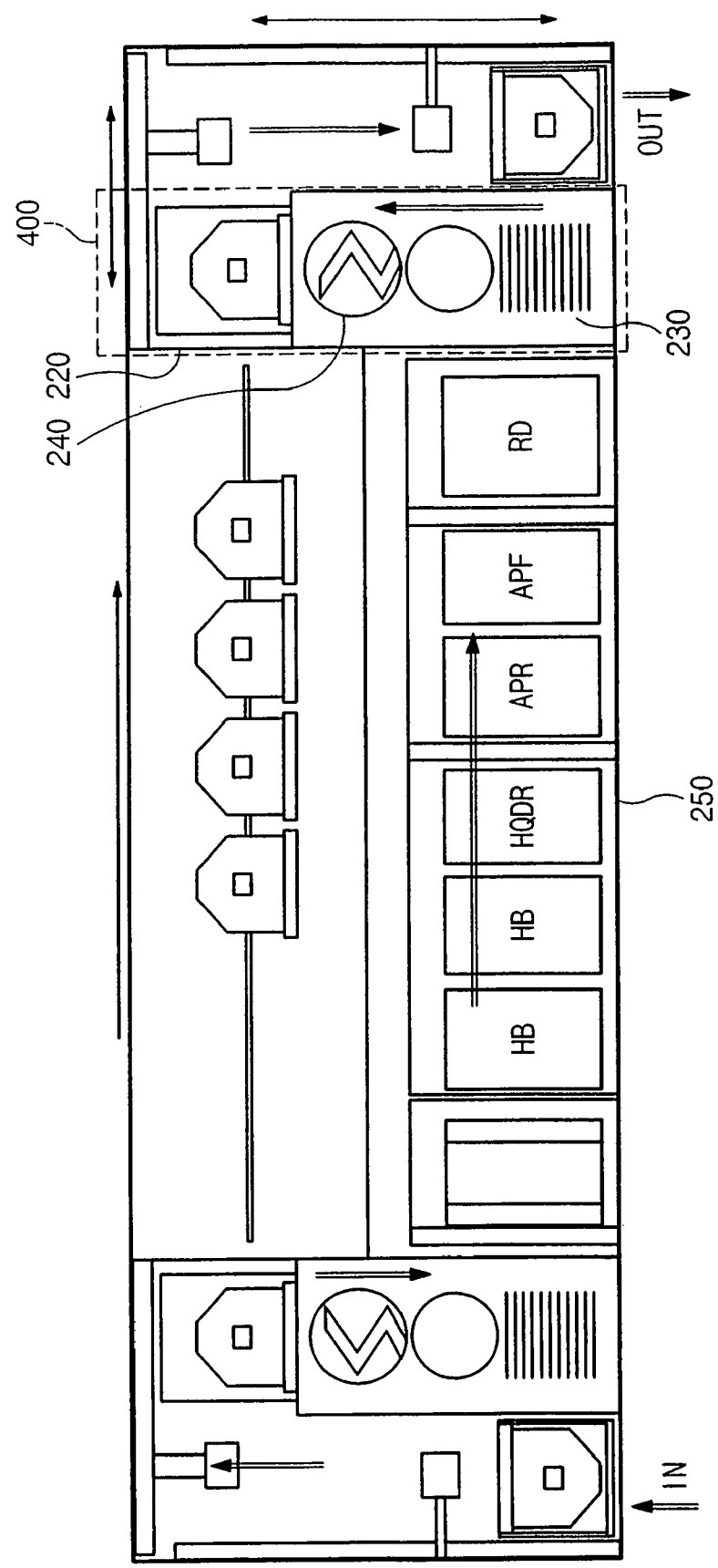
FIG. 10 is a top view of a wet station coupled to EFEMs.

Referring to FIGS. 9 and 10, in a semiconductor manufacturing process, wafers are cleaned at wet baths 250 and stocked in the FOUP 220. While the FOUP 220 is empty, the inert gas nozzle 200 introduces gas into the FOUP 220 for about 20 seconds. After gas fills the FOUP 220 via a control valve, wafers are transferred into the FOUP 220 by a robot 240.

During manufacturing of semiconductor devices, wafers having sources, drains, gate electrodes and isolation areas such as shallow trench isolation (STI) are deposited with a dielectric layer by a conventional chemical vapor deposition (CVD) method. Then contact holes (or self-aligned contacts) are formed to expose surfaces of sources/drains by etching the dielectric layer. After etching with chemicals, the residue on the contact hole should be removed and cleaned in the wet baths. The wafers are transferred for subsequent manufacturing process steps, such as filling the contact hole with polysilicon.

In conventional processing systems, however, wafers with contact holes have a tendency to grow undesired silicon dioxide because the silicon surface of the contact holes is exposed to air. To eliminate this problem, the purpose of filling gas in the FOUP is to prevent the growth of silicon dioxide in the contact hole. After wafers 230 are stocked in the FOUP 220, the inert gas nozzle 300 purges air out of the FOUP and prevents intake from the outside of the FOUP 220 by a control valve. A FOUP opener closes the FOUP with a lid and the FOUP 220 is unloaded. The shapes of inert gas nozzles 200, 300 can be rectangular, cylindrical, elongated triangle, etc., which may have a plurality of holes or elongated slits for the gas.

Figure 11A:
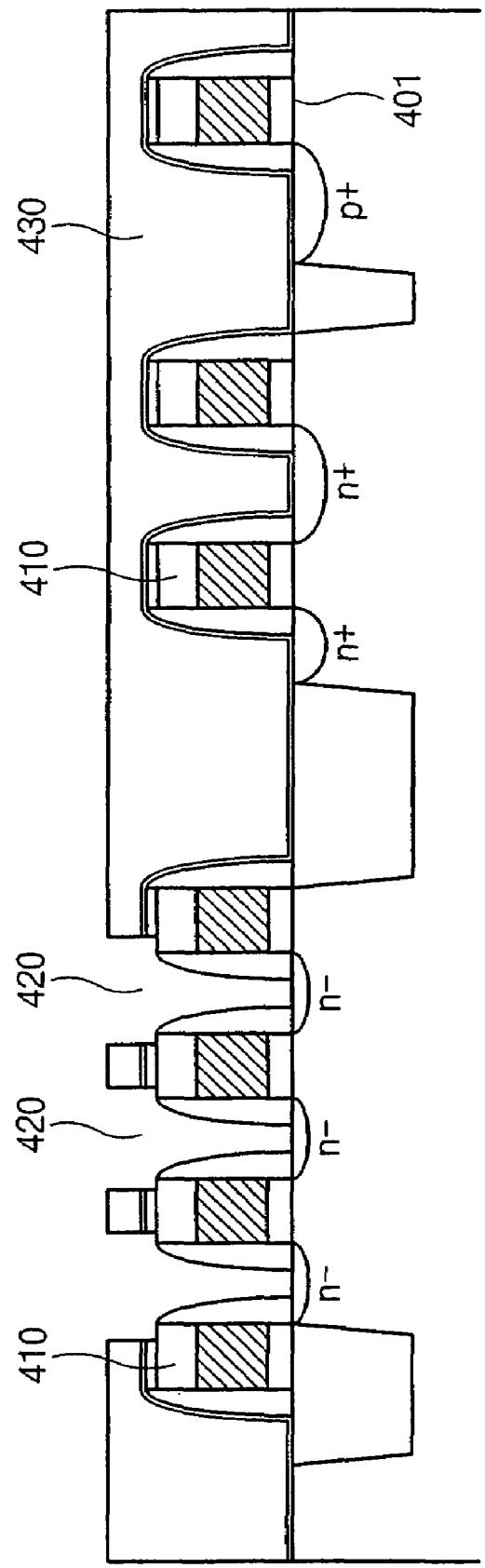
FIGS. 11A and 11B contain schematic cross-sectional views of semiconductor devices in a manufacturing process of forming a self-aligned contact (SAC) and depositing a conductive layer, in accordance with the present invention.
Figure 11B:
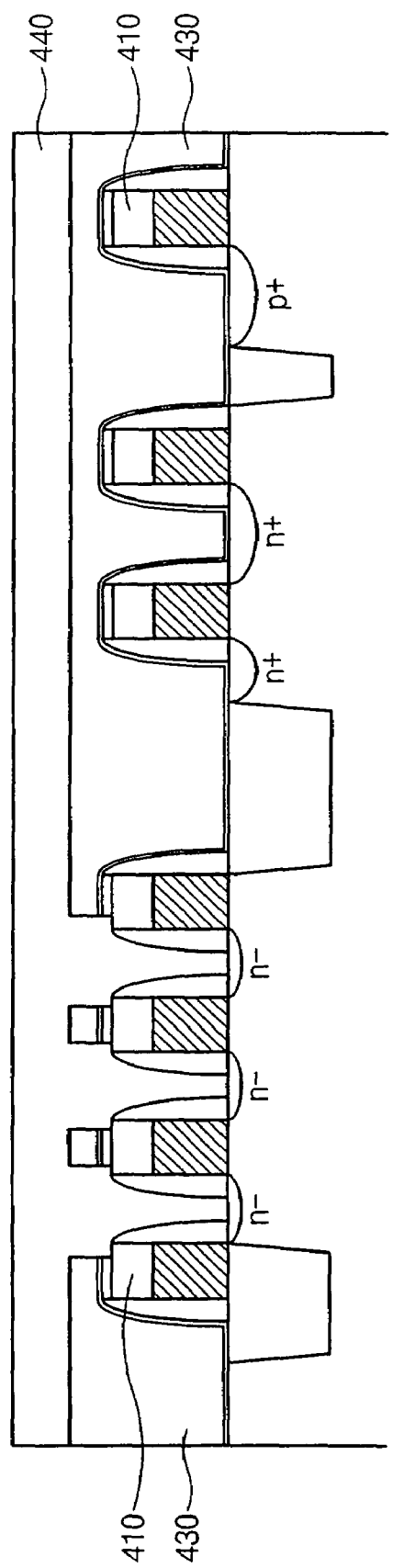

FIGS. 11A and 11B contain schematic cross-sectional views of semiconductor devices in a manufacturing process of forming a self-aligned contact (SAC) and depositing a conductive layer, in accordance with the present invention. After gate electrodes 410 and an interdielectric layer 430 are formed on the semiconductor substrate 401, a SAC (contact hole) 420 is formed by a conventional method. The interdielectric layer 430 can be Boron Phosphorus Silicon Glass (BPSG). After etching the interdielectric layer 430, a cleaning process is conventionally performed with chemicals such as dilute HF for removing polymer on the contact hole 420 in order to prevent increase in the contact resistance. When contaminants such as polymer or silicon dioxide are present, a polysilicon layer 440 of about 3000 Å of thickness and the surface of the contact hole can deteriorate. So, after cleaning wafers in chemical baths 250, wafers 230 are transferred into the EFEM 400 and are transferred into the FOUP 220 by a robot 240 shown in FIG. 10. During the transfer in the EFEM 400 shown in FIG. 10, wafers may be exposed to air and native oxide may form in the contact hole as a result. In accordance with the invention, the inert has nozzles 200 and 300 can prevent wafers from becoming contaminated and having native oxide formed on them.

While this invention has been particularly shown and described with reference to preferred embodiments thereof, it will be understood by those skilled in the art that various changes in form and details may be made therein without departing from the spirit and scope of the invention as defined by the appended claims.

The invention claimed is:

1. A method for processing a wafer, comprising:
   providing a flow chamber having a first gas inlet for allowing a first gas to flow in the flow chamber;
   providing a wafer inlet at which the wafer enters the flow chamber, the wafer inlet being coupled to a wafer storage device;
   providing a wafer outlet at which the wafer exits the flow chamber, the wafer outlet being adapted to be coupled to a wafer processing apparatus;
   providing a robotic apparatus in the flow chamber for moving the wafer from the wafer inlet to the wafer outlet; and
   allowing a second gas from a second gas inlet to enter the flow chamber such that a mixture gas including a combination of the first gas and the second gas flows into the wafer storage device, such that the amount of contaminants entering the wafer storage device is reduced, wherein the mixture gas has a substantially laminar flow in the flow chamber.

2. The method of claim 1, wherein the first gas comprises clean air.

3. The method of claim 1, wherein the second gas comprises inert gas.

4. The method of claim 3, wherein the inert gas is a gas selected from nitrogen, helium, and argon.

5. The method of claim 1, wherein the first gas and the second gas comprise clean air and inert gas, respectively.

6. The method of claim 1, wherein the second gas inlet is installed at an upper side of the flow chamber.

7. The method of claim 1, wherein a speed of the first gas and the second gas is reciprocally determined for laminar flow.

8. The method of claim 1, wherein the second gas inlet has a shape selected from rectangular, cylindrical, and elongated triangle, and has a plurality of holes.

9. The method of claim 1, wherein wafers in the wafer storage device are transferred to process equipment, the process equipment being one of chemical vapor deposition (CVD) equipment and dry etching equipment.

10. The method of claim 9, wherein the mixture gas purges contaminants in the wafer storage device.

11. The method of claim 1, wherein the wafer storage device is a front opening unified pod (FOUP).

12. The method of claim 1, wherein the method further comprises allowing a third gas to enter the flow chamber, such that the mixture gas is a combination of the first gas, the second gas and the third gas.

13. The method of claim 1, wherein the wafer processing apparatus is an equipment front-end module (EFEM).

14. The method of claim 1, wherein the robotic apparatus is a wafer handler.

15. A method for manufacturing a semiconductor device, comprising:
   storing a semiconductor wafer on which the device is manufactured in a wafer storage device;
   performing a manufacturing process on the wafer in a wafer processing apparatus; and
   transferring the wafer between the wafer storage device and the wafer processing apparatus using a wafer transfer apparatus, said transferring comprising:
      providing a flow chamber having a first gas inlet for allowing a first gas to flow in the flow chamber,
      coupling a wafer inlet at which the wafer enters the flow chamber to the wafer storage device,
      coupling a wafer outlet at which the wafer exits the flow chamber to the wafer processing apparatus,
      moving the wafer from the wafer inlet to the wafer outlet using a robotic apparatus, and
      allowing a second gas to enter the flow chamber through a second gas inlet such that a mixture gas including a combination of the first gas and the second gas flows into the wafer storage device, such that the amount of contaminants entering the wafer storage device is reduced, wherein the mixture gas has a substantially laminar flow in the flow chamber.

16. The method of claim 15, wherein the first gas comprises clean air.

17. The method of claim 15, wherein the second gas comprises inert gas.

18. The method of claim 17, wherein the inert gas is a gas selected from nitrogen, helium, and argon.

19. The method of claim 15, wherein the first gas and the second gas comprise clean air and inert gas, respectively.

20. The method of claim 15, wherein the second gas inlet is installed at an upper side of the flow chamber.

21. The method of claim 15, wherein a speed of the first gas and the second gas is reciprocally determined for laminar flow.

22. The method of claim 15, wherein the second gas inlet has a shape selected from rectangular, cylindrical, and elongated triangle, and has a plurality of holes.

23. The method of claim 15, wherein wafers in the wafer storage device are transferred to process equipment, the process equipment being one of chemical vapor deposition (CVD) equipment and dry etching equipment.

24. The method of claim 23, wherein the mixture gas purges contaminants in the wafer storage device.

25. The method of claim 15, wherein the wafer storage device is a front opening unified pod (FOUP).

26. The method of claim 15, wherein the method further comprises allowing a third gas from a third gas inlet to enter the flow chamber, such that the mixture gas is a combination of the first gas, the second gas and the third gas.

27. The method of claim 15, wherein the wafer processing apparatus is an equipment front-end module (EFEM).

28. The method of claim 15, wherein the robotic apparatus is a wafer handler.

* * * * *